United States Patent [19]

Gawler et al.

[11] 4,270,102

[45] May 26, 1981

[54] INTEGRATED CIRCUIT FM LOCAL OSCILLATOR WITH AFC CONTROL AND TEMPERATURE COMPENSATION

[75] Inventors: Glenn B. Gawler, Liverpool; Robert J. McFadyen, Syracuse, both of N.Y.

[73] Assignee: General Electric Company, Syracuse, N.Y.

[21] Appl. No.: 33,358

[22] Filed: Apr. 26, 1979

[51] Int. Cl.³ .............................................. H03B 5/12
[52] U.S. Cl. ................................ 331/115; 331/117 R; 331/176; 331/177 R
[58] Field of Search .................... 331/115, 117 R, 114, 331/176, 108 D, 177 R, 177 V; 455/196, 197, 199, 208, 255, 257, 258, 318

[56] References Cited

U.S. PATENT DOCUMENTS

| 3,963,996 | 6/1976 | Skerlos | 331/117 R |
| 4,063,193 | 12/1977 | Wilcox | 331/117 R |

*Primary Examiner*—Siegfried H. Grimm
*Attorney, Agent, or Firm*—Richard V. Lang; Carl W. Baker

[57] ABSTRACT

A FM local oscillator circuit suitable for integrated circuit fabrication, the frequency of which responds to a first current component for reducing frequency drift of a tuned frequency as a function of temperature and to a second current component for providing automatic frequency control of said tuned frequency. The circuit comprises a cross coupled differential pair of transistors, adapted to be coupled to a tuned circuit manually tunable over a given frequency range, which exhibit a negative conductance substantially controlled by said first current component for sustaining oscillations over said given frequency range and which further exhibit a variable capacitance controlled by said second current component for providing electronic fine tuning of the oscillator circuit. The emitters of the differential transistor pair are joined and coupled to first and second current sources, the first of which is temperature compensated for generating said first current component and the second of which is selectively controlled by an AFC control signal for generating said second current component.

3 Claims, 3 Drawing Figures

INTEGRATED CIRCUIT FM LOCAL OSCILLATOR WITH AFC CONTROL AND TEMPERATURE COMPENSATION

BACKGROUND OF THE INVENTION

The invention relates to oscillator circuits and in particular, to FM local oscillator circuits with automatic frequency control (AFC) that are suitable for integrated circuit (IC) fabrication.

In the present state of the broadcast radio receiver art, substantial progress has been achieved in fabricating much of the AM and FM circuitry in monolithic IC form, including the AM mixer and AM local oscillator, the IF amplifier, the AM and FM detectors and the audio amplifier. Examples of this form of circuitry may be found in U.S. Pat. No. 3,936,750, entitled "AM-FM Receiver Having Improved Bias Supply Circuit", William Peil and Robert J. McFadyen, issued Feb. 3, 1976; U.S. Pat. No. 3,999,138, entitled "Detector for AM-FM Signals", William Peil and Robert J. McFadyen, issued Dec. 21, 1976; and U.S. Pat. No. 4,025,871, entitled "Audio Amplifier for Integrated Circuit Fabrication Having Controlled Idling Current", William Peil, issued May 24, 1977. However, a number of difficulties have thus far existed with respect to adapting the FM mixer and FM local oscillator circuit to IC fabrication. In particular, difficulties regarding IC adaptation of the FM local oscillator relate primarily to the relatively high frequency of operation of these circuits normally requiring a high frequency IC processing, and the need to exhibit a sensitivity to automatic frequency control, which is a desirable property for FM operation. As a result, prior to the present invention FM local oscillator circuits have not been integrated with those radio receiver circuits previously fashioned in monolithic IC form.

SUMMARY OF THE INVENTION

It is accordingly an object of the invention to extend the present monolithic integration of radio receiver circuitry by providing a novel and improved FM local oscillator circuit that is readily adapted to IC fabrication.

It is another object of the invention to provide a novel and improved FM local oscillator circuit readily adapted to IC fabrication which exhibits a highly stable oscillator frequency.

It is a further object of the invention to provide a novel and improved FM local oscillator circuit as described that is responsive to automatic frequency control.

It is another object of the invention to provide a novel and improved FM local oscillator circuit as described that is temperature compensated against frequency drift.

It is a further object of the invention to provide a novel and improved FM local oscillator circuit as described that can be combined in monolithic IC form with other, lower frequency, radio receiver circuits so as not to require change in the medium frequency IC process normally employed for such other circuits.

These and additional objects are accomplished, in accordance with one aspect of the present invention, in a FM local oscillator circuit fabricated in integrated circuit form with only the oscillator tuned circuit external to the integrated circuit, the oscillator comprising a cross coupled differential pair of transistors with the collector and base of one transistor coupled to the base and collector, respectively, of the other transistor and the collectors of said transistors coupled to said tuned circuit which is manually tunable over a given frequency range, said transistors constructed so as to exhibit in response to current flow therein a negative conductance for sustaining oscillations over said given frequency range and a current responsive variable capacitance for providing electronic fine tuning of the oscillator frequency, the emitters of said transistors joined together and coupled to current sources, means for generating a first substantially constant current component for controlling the value of said negative conductance and a second variable current component responsive to an automatic frequency control signal for controlling the value of said variable capacitance.

In accordance with another aspect of the present invention, the oscillator circuit further comprises a temperature compensation network for providing temperature compensation to said substantially constant current component.

BRIEF DESCRIPTION OF THE DRAWINGS

While the specification concludes with the claims which particularly point out and distinctly claim that subject matter which is regarded as inventive, it is believed the invention will be more clearly understood when considering the following detailed description taken in connection with the accompanying figures of the drawing, in which:

DESCRIPTION OF A PREFERRED EMBODIMENT

Figure 1:
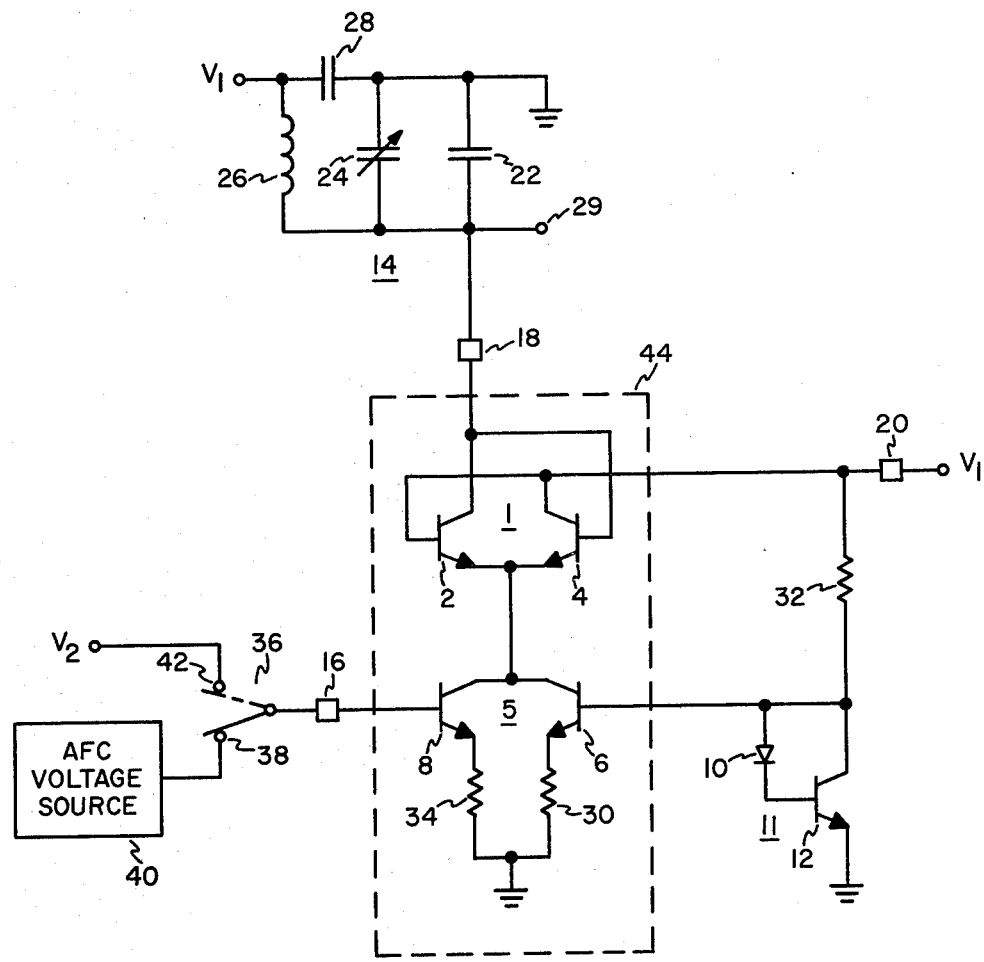
FIG. 1 is a schematic diagram of a FM local oscillator circuit in accordance with the invention.

With respect to FIG. 1, there is illustrated a radio receiver FM local oscillator circuit suitable for IC fabrication, which in accordance with the invention is responsive to a first, temperature compensated current component for reducing drift of a tuned frequency and to a second current component for providing automatic control of said tuned frequency. The circuit includes a cross coupled differential transistor pair 1 of transistors 2 and 4, current source means 5 composed of a first current source transistor 6 providing said first current component and a second current source transistor 8 providing said second current component, a diode 10 and transistor 12 providing a temperature compensating bias for said first current component and a tuned circuit 14. All of the circuit internal to chip pads 16, 18 and 20, can be fabricated on an IC chip employing an IC process of medium frequency, e.g., $f_t = 300$ MHz, $f_t$ being the frequency at which transistor $\beta$ becomes unity.

The tuned circuit 14 includes the parallel connection of a fixed capacitor 22, a variable capacitor 24 and an inductor 26, capacitor 24 providing manual tuning of the circuit over a given frequency range, which for FM operation is typically on the order of 100 to 120 MHz. One terminal of capacitors 22 and 24 are at ground and coupled through an RF bypass capacitor 28 to one terminal of the inductor and to a dc voltage source $V_1$. The other terminal of capacitors 22 and 24 and of inductor 26 are joined and coupled to pad 18 and to an output terminal 29.

Pad 18 is coupled to the collector of transistor 2 and to the base of transistor 4, all transistors of the described circuit being of NPN type. The collector of transistor 4 is coupled to the base of transistor 2 and to pad 20 which is adapted to be coupled to voltage source $V_1$. The emitters of transistors 2 and 4 are joined together and connected to the joined collectors of transistors 6 and 8. The emitter of transistor 6 is coupled through a current determining resistor 30 to ground, and its base is coupled to a temperature compensating network 11 composed of diode 10, transistor 12 and a current limiting resistor 32. The base of transistor 6 is connected to the junction of one terminal of resistor 32, the anode of diode 10 and the collector of transistor 12. The other terminal of resistor 32 is connected to pad 20, the cathode of diode 10 connected to the base of transistor 12, and the emitter thereof is connected to ground.

The emitter of transistor 8 is connected through a current determining resistor 34 to ground and its base is connected to pad 16. Pad 16 is adapted to be connected to a manually operated switch 36 having a first fixed contact 38 connected to a source 40 of AFC voltage for supplying AFC signals to the base of transistor 8, and a second fixed contact 42 connected to a dc voltage source $V_2$ for supplying a fixed control signal to the base of transistor 8.

In one exemplary embodiment of the present invention the following circuit components and values were employed, which are given primarily for purposes of illustration and not intended to be limiting of the claimed invention:

| Transistors | 2, 4, 6, 8, 12 | NPN type |
|---|---|---|
| Diode | 10 | base emitter junction diode |
| Resistors | 30 | 430 ohms |
| | 32 | 5 Kohms |
| | 34 | 2.7 Kohms |
| Capacitors | 22 | 24 pf |
| | 24 | 10–30 pf |
| | 28 | .001 μf |
| Inductor | 26 | .05 μh |
| Voltage $V_1$ | | 3 volts dc |
| $V_2$ | | 1.2 volts dc |

In the operation of the FM local oscillator circuit of FIG. 1, the cross coupled collector to base connections of differential transistors 2 and 4 cause these transistors to alternately conduct current that is established by current source means 5 so as to provide an output voltage at output terminal 29 which oscillates at the frequency to which the circuit is tuned. The cross coupled differential transistor pair 1 and current source means 5, shown within broken line block 44, exhibit a negative conductance which is responsive to and varies as a function of emitter current for sustaining oscillations at least over the frequency range through which the tuned circuit 14 is tunable. In addition, transistors 2 and 4 exhibit a variable capacitance which also is responsive to and varies as a function of the emitter current. The variable capacitance is composed primarily of the diffusion capacitance existing between base and emitter electrodes of transistors 2 and 4. Transistors 2 and 4 also exhibit a relatively fixed capacitance which comprises the junction capacitance existing between the base and collector of transistors 2 and 4 and stray capacitance.

Neglecting the junction and stray capacitance effects since they do not enter into the operation of the present circuit, the input admittance Y at the output terminal 29 looking into the collector of transistor 2 may be expressed as follows:

$$Y = \frac{1 - \beta}{2(r_b + \beta r_e)} \quad (1)$$

where $r_b$ and $r_e$ are the base and emitter resistances, respectively, of each of transistors 2 and 4. Further, $\beta$ may be expressed as:

$$\beta = \frac{\beta_o}{1 + j\frac{\omega \beta_o}{\omega_t}} \quad (2)$$

where $\beta_o$ is dc or low frequency value of $\beta$, $\omega$ is proportional to a given frequency and $\omega_t$ is proportional to $f_t$. For the relatively low frequency case, for purposes of the present discussion at around 1 to 2 MHz, $\beta \simeq \beta_o$ and $Y_{low}$ may be expressed as:

$$Y_{low} = \frac{1 - \beta_o}{2(r_b + \beta_o r_e)} \quad (3)$$

From expression (3) it is seen that at low frequencies the input admittance to the differential transistor pair 1 is composed substantially of a real component having a value of approximately $-1/(2r_e)$, with no reactive component. From this it may be appreciated that the negative conductance property arises principally out of the $r_e$ term which varies inversely as a function of emitter current.

On the other hand, for the relatively high frequency case of interest, in the 100 to 120 MHz region, $\beta = -j(\omega_t/\omega)$ and $Y_{hi}$ may be expressed as:

$$Y_{hi} = \frac{1 + j\frac{\omega_t}{\omega}}{2(r_b - j\frac{\omega_t r_e}{\omega})} \quad (4)$$

From expression (4) it is seen that the input admittance is composed of an appreciable reactive component. The term $\omega_t r_e/\omega$ is in the nature of the circuit capacitive reactance attributable to the diffusion capacitance, and $r_b$ is in the nature of the circuit resistance. For negative conductance to exist the following condition must pertain:

$$\frac{\frac{\omega_t r_e}{\omega}}{r_b} \times \frac{\omega_t}{\omega} > 1 \quad (5)$$

The net result is that the negative conductance, which is necessary to sustain oscillation, is strongly influenced by the base resistance $r_b$. In ordinary IC NPN configurations utilizing single base contact stripes, the base resistance $r_b$ is too high to permit the circuit to oscillate in the elevated frequency range of interest when employing a medium frequency IC process. By means of a transistor configuration for the transistors 2 and 4 which utilizes double base contact stripes, $r_b$ is substantially reduced which increases the negative conductance so as to extend the frequency range of oscillation and readily permit oscillation in the 100 to 120 MHz region.

Figure 2:
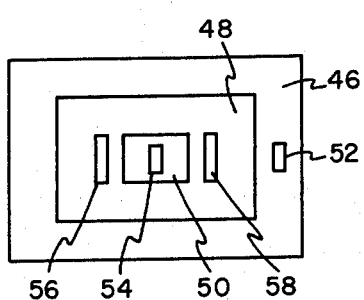
FIG. 2 is a plan view illustrating the IC construction of one of the differential pair transistors of the oscillator circuit of FIG. 1.

In FIG. 2 is a plan view illustrating the IC construction of an NPN transistor utilizing double base contact stripes, corresponding to the transistor configuration of either of transistors 2 or 4. N type collector material 46 forms the bottom layer of the transistor configuration, a portion of which is overlaid by P type base material 48. A portion of the base material in turn is overlaid by N type emitter material 50. A collector contact 52 is formed on the exposed surface of the collector material and an emitter contact 54 is similarly formed on the surface of the emitter material. For reducing the base resistance $r_b$, a pair of base contacts 56 and 58 are formed on the exposed surface of the base material to either side of the emitter region. The double base contact stripes reduce the base resistance $r_b$ by a factor of 4 over that of a single contact stripe. A further discussion concerned with achieving a reduction in base resistance using double contact stripes is included in a text entitled, "Integrated Circuit Engineering: Fabrication, Design and Application", Arthur Glaser and Gerald E. Subak-Sharpe, at pages 51 through 53 published by the Addison-Wesley Publishing Company, Reading, Mass., Copyright 1977.

Figure 3:
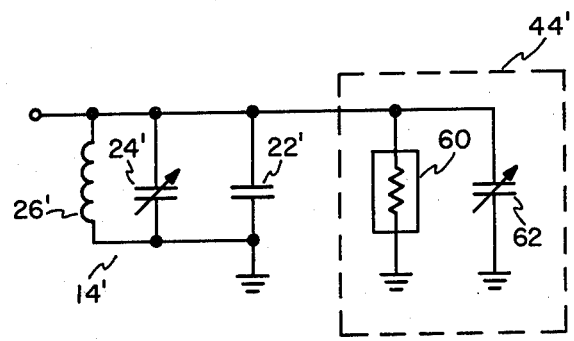
FIG. 3 is an equivalent circuit of the oscillator circuit of FIG. 1 employed in the description of the invention.

Considering further the operation of the circuit of FIG. 1, the negative conductance and variable capacitance properties of the differential transistor pair 1 are effectively coupled in parallel with the tuned circuit 14, as illustrated in the RF equivalent circuit of FIG. 3, which includes a negative conductance 60 and a variable capacitance 62 within block 44' in parallel with capacitors 22' and 24' and inductor 26' of tuned circuit 14'. As explained, by employing a sufficiently large negative conductance, oscillation of the circuit will be sustained within the frequency region of interest. The frequency of oscillation is determined by the LC components of the tuned circuit 14' and by the variable capacitance 62, which corresponds to the diffusion capacitance of the differential transistor pair. The circuit is subject to coarse tuning by the manual adjustment of capacitor 24' and to fine tuning by the electronic adjustment of variable capacitance 62 by means of current control.

Referring again to FIG. 1, the diffusion capacitance of the differential transistor pair 1 is responsive to emitter current, which is equal to the sum of the currents in current source transistors 6 and 8. In particular, the diffusion capacitance is a direct function of emitter current. Thus, as emitter current increases, the capacitance increases to reduce the frequency of oscillation. Conversely, a decrease in emitter current decreases the capacitance and increases frequency. The diffusion capacitance is controlled to compensate for temperature drift originating in other portions of the oscillator circuit. A voltage is established at the collector of transistor 12, and therefore at the base of transistor 6, which is determined by the forward biased junction voltage of diode 10 and the base emitter voltage of transistor 12, where the junction voltages are set by the current in resistor 32 in accordance with the logarithmic law that relates forward biased junction voltages to junction currents. This voltage reduced by the voltage drop across the base-emitter junction ($V_{be}$) of transistor 6 and the value of resistor 30 determine the emitter current in transistor 6, which has been referred to as the first current component. Because the base-emitter junction of transistor 6 and the junction of diode 10 have about the same voltage across them and possess similar temperature coefficients, the $V_{be}$ voltage of transistor 6 approximately matches the $V_{be}$ voltage of transistor 12 in the presence of temperature variations and the voltage across resistor 30 is always approximately equal to the voltage drop of diode 10.

In the practical implementation of oscillators of this type the temperature coefficients of the intrinsic elements, and notably the diffusion capacitance, are inherently positive. That is, as temperature increases the value of the LC product will also increase, thereby causing a corresponding decrease in frequency, with the opposite result for a decrease in temperature. Frequency drift exceeding 1 percent over a 60° C. temperature range is not unusual in an uncompensated oscillator circuit.

The previously described bias arrangement for setting the current in transistor 6 contains a mechanism for compensating the inherent drift of oscillator frequency. Accordingly, since the forward junction drops of transistors 6 and 12 and of diode 10 have a negative temperature coefficient, and since resistor 30 has a positive temperature coefficient, it follows that the emitter current in transistor 6 will be inversely related to temperature. Since diffusion capacitance is proportional to emitter current, an increasing temperature will cause a corresponding decrease in capacitance, and a decreasing temperature will cause a corresponding increase in capacitance. The circuit values have been designed so that changes in diffusion capacitance via this current bias control compensate the aforementioned intrinsic changes of other circuit elements. One embodiment of the disclosed circuit showed a reduced temperature drift to 0.1 percent over the aforementioned temperature range.

With respect to the current control of transistor 8, with the switch 36 at fixed contact 42 and no AFC control in effect, voltage $V_2$ is applied to the base of transistor 8 for producing a relatively constant current therein, which has been referred to as the second current component. This current is determined by $V_2$ less $V_{be}$ of transistor 8 and the value of resistor 34, which current is a fraction of the current in transistor 6. With switch 36 at fixed contact 38 on AFC voltage, conventionally derived from the output of an FM detector circuit, is applied to the base of transistor 8, which voltage varies about the voltage $V_2$ in accordance with the need for correction. The AFC signal therefore acts to control the current in transistor 8 for appropriately varying the diffusion capacitance to maintain a precise tuning of the circuit in accordance with the AFC function.

While the invention has been described with reference to a specific embodiment, the following claims are intended to include within their meaning all modifications and alternatives of the circuit that fall within the true scope and spirit of the invention.

What we claim as new and desire to secure as Letters Patent of the United States is:

1. A local oscillator circuit for fabrication by an integrated circuit process of a given high frequency performance, having an improved higher frequency range, said circuit including in combination
   A. a tuned circuit, tunable over said higher frequency range,
   B. a cross coupled differential pair of transistors with the collector and base of one transistor coupled to the base and collector, respectively, of the other transistor and the emitters of said transistors joined together, the collectors of said pair of transistors being coupled to said tuned circuit, C. said transistors with current flow therein being constructed to exhibit an emitter current responsive variable capacitance and substantial negative conductance over said higher frequency range, said construction including the provision of a double base contact stripe for reduction of the base resistance, and D. current source means coupled to said emitters for providing an emitter current in said transistors at a level providing said negative conductance to ensure oscillation and including a controlled current component for capacitance control of the oscillation frequency.

2. A local oscillator as in claim 1 wherein the intrinsic elements of the circuit including said variable capacitance are temperature sensitive, exhibiting a positive temperature coefficient, and said current source means comprises:

A. a first current source for providing a first controlled current component including
  (1) a first current setting resistance having a positive temperature coefficient, and
  (2) a third transistor having its collector coupled to the emitters of the differential transistor pair, and its emitter coupled to said resistance, B. a negative temperature coefficient compensating reference voltage means comprising a pair of serially connected forward biased junctions coupled in parallel with the base-emitter junction of said third transistor,
  (1) one of said forward biased junctions and said base-emitter junction having approximately equal temperature coefficients so that in response to temperature drift a resulting change in voltage across said base-emitter junction is matched by a similar change in voltage across said one forward biased junction, and
  (2) the voltage across the other of said forward biased junctions establishing a voltage having a negative temperature coefficient across said first current setting resistance for generating said first controllable current component in a sense to decrease emitter current with increasing temperature to stabilize the frequency of oscillation of the circuit against temperature.

3. A local oscillator circuit as in claim 2 wherein said current source comprises:

A. a second current source for providing a second controlled current component including
  (1) a source of automatic frequency control signals, and
  (2) a fourth transistor having the collector joined to the collector of said third transistor, its emitter coupled to a second current setting resistance and its base switchably coupled to said automatic frequency control source.

* * * * *